(12) United States Patent
Lo et al.

(10) Patent No.: US 11,217,706 B2
(45) Date of Patent: Jan. 4, 2022

(54) DIODE STRUCTURE AND MANUFACTURING METHOD THEREOF

(71) Applicant: Mosel Vitelic Inc., Hsinchu (TW)

(72) Inventors: Hsiu-Fang Lo, Hsinchu (TW); Yu-Hsuan Chang, Hsinchu (TW)

(73) Assignee: MOSEL VITELIC INC., Hsinchu (TW)

( * ) Notice: Subject to any disclaimer, the term of this patent is extended or adjusted under 35 U.S.C. 154(b) by 0 days.

(21) Appl. No.: 16/917,248

(22) Filed: Jun. 30, 2020

(65) Prior Publication Data

US 2021/0242352 A1 Aug. 5, 2021

(30) Foreign Application Priority Data

Feb. 5, 2020 (TW) .................................. 109103592

(51) Int. Cl.
| | |
|---|---|
| *H01L 29/866* | (2006.01) |
| *H01L 29/66* | (2006.01) |
| *H01L 29/06* | (2006.01) |
| *H01L 21/265* | (2006.01) |
| *H01L 21/266* | (2006.01) |
| *H01L 21/225* | (2006.01) |

(52) U.S. Cl.
CPC ........ *H01L 29/866* (2013.01); *H01L 21/2253* (2013.01); *H01L 21/266* (2013.01); *H01L 21/26513* (2013.01); *H01L 21/26586* (2013.01); *H01L 29/0684* (2013.01); *H01L 29/66136* (2013.01)

(58) Field of Classification Search
CPC ............. H01L 29/866; H01L 29/66136; H01L 21/2253; H01L 21/266; H01L 21/26586; H01L 29/0684; H01L 21/26513
See application file for complete search history.

(56) References Cited

U.S. PATENT DOCUMENTS

| | | | | |
|---|---|---|---|---|
| 8,377,757 B2 * | 2/2013 | Hawe | ................... | H01L 27/0255 |
| | | | | 438/140 |
| 10,109,718 B2 * | 10/2018 | Sharma | ............... | H01L 29/8611 |
| 2008/0217749 A1 | 9/2008 | Matteson et al. | | |

FOREIGN PATENT DOCUMENTS

| | | |
|---|---|---|
| TW | I441315 B | 6/2014 |
| TW | I493677 B | 7/2015 |
| TW | I683495 B | 1/2020 |

* cited by examiner

*Primary Examiner* — David Vu
(74) *Attorney, Agent, or Firm* — Kirton McConkie; Evan R. Witt

(57) ABSTRACT

A diode structure and a manufacturing method are disclosed. The diode structure includes a semiconductor substrate, a first semiconductor layer, a second semiconductor layer and an epitaxy layer. The semiconductor substrate includes a first surface. The first semiconductor layer and the second semiconductor layer are extended toward the interior of the semiconductor substrate from the first surface by implanting a dopant. Both of the semiconductor types of the first semiconductor layer and the second semiconductor layer are opposite to the semiconductor type of the semiconductor substrate. The epitaxy layer is formed on the first surface, connected with the first semiconductor layer and the second semiconductor layer and extended outwardly from the first surface. The first semiconductor layer and the second semiconductor layer are connected with each other, continuously. The concentration distribution of the dopant within the first semiconductor layer and the second semiconductor layer is in a discontinuous curve.

6 Claims, 8 Drawing Sheets

1

11,217,706 B2

DIODE STRUCTURE AND MANUFACTURING METHOD THEREOF

FIELD OF THE INVENTION

The present disclosure relates to a diode structure and a manufacturing method thereof, and more particularly to a diode structure applicable to an ultra-low capacitance TVS device and a manufacturing method thereof.

BACKGROUND OF THE INVENTION

Diodes are one of the common components in circuit systems and are widely utilized in various devices. Diodes in different structures can be applied for different purposes. For example, transient voltage suppressions (TVS) are used for protecting the circuits from voltage peaks transmitted through the wires. One of the parameters affecting the performance of TVS is junction capacitance (Cj). More specifically, if the junction capacitance of TVS is too high, the current withstand ability of TVS will be affected and cause signal attenuation. Therefore, how to achieve low junction capacitance is one of the necessary considerations when manufacturing TVS.

Generally, TVS has higher doping concentration than other diodes. However, when implanting and driving in antimony (Sb) into the heavily-doped P+ type substrate by current TVS manufacturing process, the N+ type buried layer often has a problem of poor uniformity. This problem causes the junction capacitance between the N+ type buried layer and the P+ type substrate to be high and difficult to be controlled in a stable range, which means the margin of error is large. Consequently, TVS does not work well enough to effectively provide the function of protecting the circuit.

Therefore, there is a need of providing a diode structure and a manufacturing method thereof to address the above-mentioned issues in prior arts, so as to improve the stability of diodes and achieve the efficacy of effectively protecting the circuits.

SUMMARY OF THE INVENTION

An object of the present disclosure is to provide a diode structure and a manufacturing method thereof to address the above drawbacks encountered by the prior arts.

Another object of the present disclosure is to provide a diode structure and a manufacturing method thereof. By two-step's dopant implanting and drive-in method, the N+ type first semiconductor layer and second semiconductor layer are formed in the P+ type semiconductor substrate. The concentration distribution of the dopant within the first semiconductor layer and the second semiconductor layer is in a discontinuous curve. As a result, the dopant within the first semiconductor layer and the second semiconductor layer has better distribution uniformity, thereby improving the operating stability and satisfying the application requirement of low junction capacitance. Consequently, the ultra-low capacitance TVS device with the diode structure is capable of reliably providing the function of protecting the circuit.

In accordance with an aspect of the present disclosure, a diode structure is provided. The diode structure includes a semiconductor substrate, a first semiconductor layer, a second semiconductor layer and an epitaxy layer. The semiconductor substrate includes a first surface. Both of the first semiconductor layer and the second semiconductor layer are extended toward the interior of the semiconductor substrate from the first surface of the semiconductor substrate by implanting a dopant. Both of the semiconductor types of the first semiconductor layer and the second semiconductor layer are opposite to the semiconductor type of the semiconductor substrate. The epitaxy layer is formed on the first surface of the semiconductor substrate, connected with the first semiconductor layer and the second semiconductor layer and extended outwardly from the first surface. The first semiconductor layer and the second semiconductor layer are connected with each other, continuously. The concentration distribution of the dopant within the first semiconductor layer and the second semiconductor layer is in a discontinuous curve.

In accordance with another aspect of the present disclosure, a manufacturing method of a diode structure is provided. The manufacturing method includes steps of: (a) providing a semiconductor substrate, wherein the semiconductor substrate comprises a first surface; (b) disposing at least one photoresist on the first surface of the semiconductor substrate; (c) implanting a dopant from the first surface of the semiconductor substrate to form a first semiconductor layer, wherein the semiconductor type of the first semiconductor layer is opposite to the semiconductor type of the semiconductor substrate; (d) removing the photoresist and diffusing the first semiconductor layer in the semiconductor substrate; (e) disposing the at least one photoresist on the first surface of the semiconductor substrate; (f) implanting the dopant from the first surface of the semiconductor substrate to form a second semiconductor layer within the first semiconductor layer, wherein the semiconductor type of the second semiconductor layer is opposite to the semiconductor type of the semiconductor substrate; (g) removing the photoresist and diffusing the first semiconductor layer and the second semiconductor layer in the semiconductor substrate; and (h) forming an epitaxy layer on the first surface of the semiconductor substrate.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It should be noted that the following descriptions of preferred embodiments of this disclosure are presented herein for purpose of illustration and description only. It is not intended to be exhaustive or to be limited to the precise form disclosed.

Figure 1:
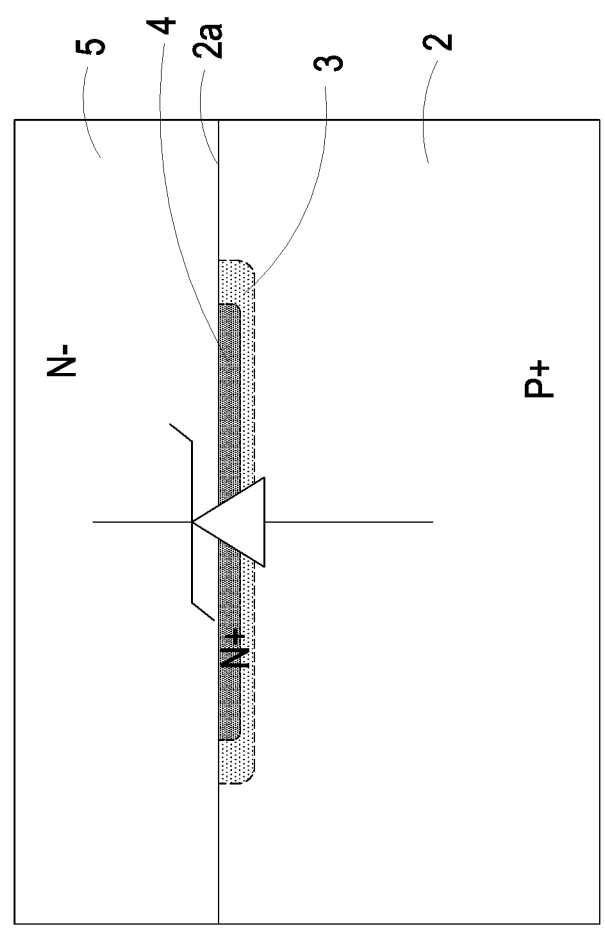
FIG. 1 is a cross sectional view illustrating a diode structure according to an embodiment of the present disclosure.
Figure 2:
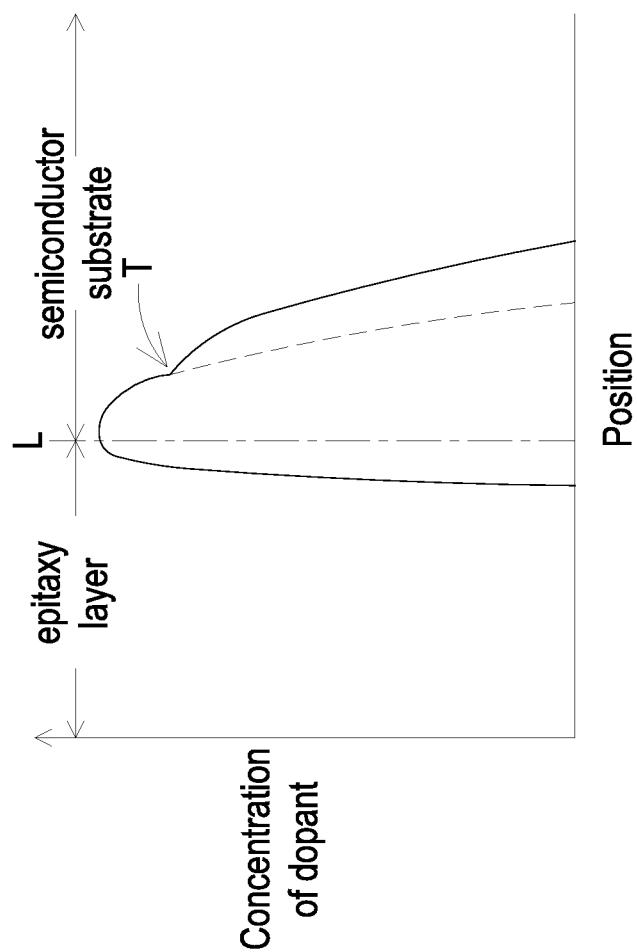
FIG. 2 is a line graph showing the concentration distribution of the dopant in the diode structure of FIG. 1.

Please refer to FIGS. 1 and 2. FIG. 1 is a cross sectional view illustrating a diode structure according to an embodiment of the present disclosure. FIG. 2 is a line graph showing the concentration distribution of the dopant in the diode structure of FIG. 1. As shown in figures, the diode structure 1 includes a semiconductor substrate 2, a first semiconductor layer 3, a second semiconductor layer 4 and an epitaxy layer 5. The semiconductor substrate 2 includes a first surface 2a. Both of the first semiconductor layer 3 and the second semiconductor layer 4 are extended toward the interior of the semiconductor substrate 2 from the first surface 2a of the semiconductor substrate 2 by implanting a dopant D. Both of the semiconductor types of the first semiconductor layer 3 and the second semiconductor layer 4 are opposite to the semiconductor type of the semiconductor substrate 2. The epitaxy layer 5 is formed on the first surface 2a of the semiconductor substrate 2, connected with the first semiconductor layer 3 and the second semiconductor layer 4 and extended outwardly from the first surface 2a. The first semiconductor layer 3 and the second semiconductor layer 4 are connected with each other, continuously. The concentration distribution of the dopant D within the first semiconductor layer 3 and the second semiconductor layer 4 is in a discontinuous curve.

Please refer to FIG. 2. In the figure, the left side represents epitaxy layer 5, and the right side represents the semiconductor substrate 2. The concentration of the dopant D in the diode structure 1 is changed from the epitaxy layer 5 to the semiconductor substrate 2. A dividing line L is corresponding to the first surface 2a of the semiconductor substrate 2. An inflection point T is corresponding to the connecting surface between the first semiconductor layer 3 and the second semiconductor layer 4. As shown in FIG. 2, in this embodiment, the concentration of the dopant D is gradually increased from the position near to the semiconductor substrate 2 inside the epitaxy layer 5. The maximum concentration of the dopant D is at the first surface 2a of the semiconductor substrate 2. Then, the concentration of the dopant D is gradually decreased toward the interior of the semiconductor substrate 2 along a first decreasing curve and to the inflection point T. After the inflection point T, the concentration of the dopant D is gradually decreased along a second decreasing curve. In other words, the decreasing curve of the dopant D is inflected at the connecting surface between the first semiconductor layer 3 and the second semiconductor layer 4. That is, the concentration distribution of the dopant D within the first semiconductor layer 3 and the second semiconductor layer 4 is in the discontinuous curve. Consequently, the uniformities of the dopant D within the first semiconductor layer 3 and the second semiconductor layer 4 are improved.

In this embodiment, the semiconductor substrate 2 is a P+ type semiconductor layer. Both of the first semiconductor layer 3 and the second semiconductor layer 4 are N+ type semiconductor layers. The concentration of the dopant D within the first semiconductor layer 3 is lower than the concentration of the dopant D within the second semiconductor layer 4. The dopant D is an ion belonging to VA group element, such as antimony (Sb) ion, but not limited thereto. The epitaxy layer 5 is a N− type semiconductor layer. Consequently, the diode structure 1 can be utilized as a zener diode and is applicable to an ultra-low capacitance TVS device, but not limited thereto.

Figure 3:
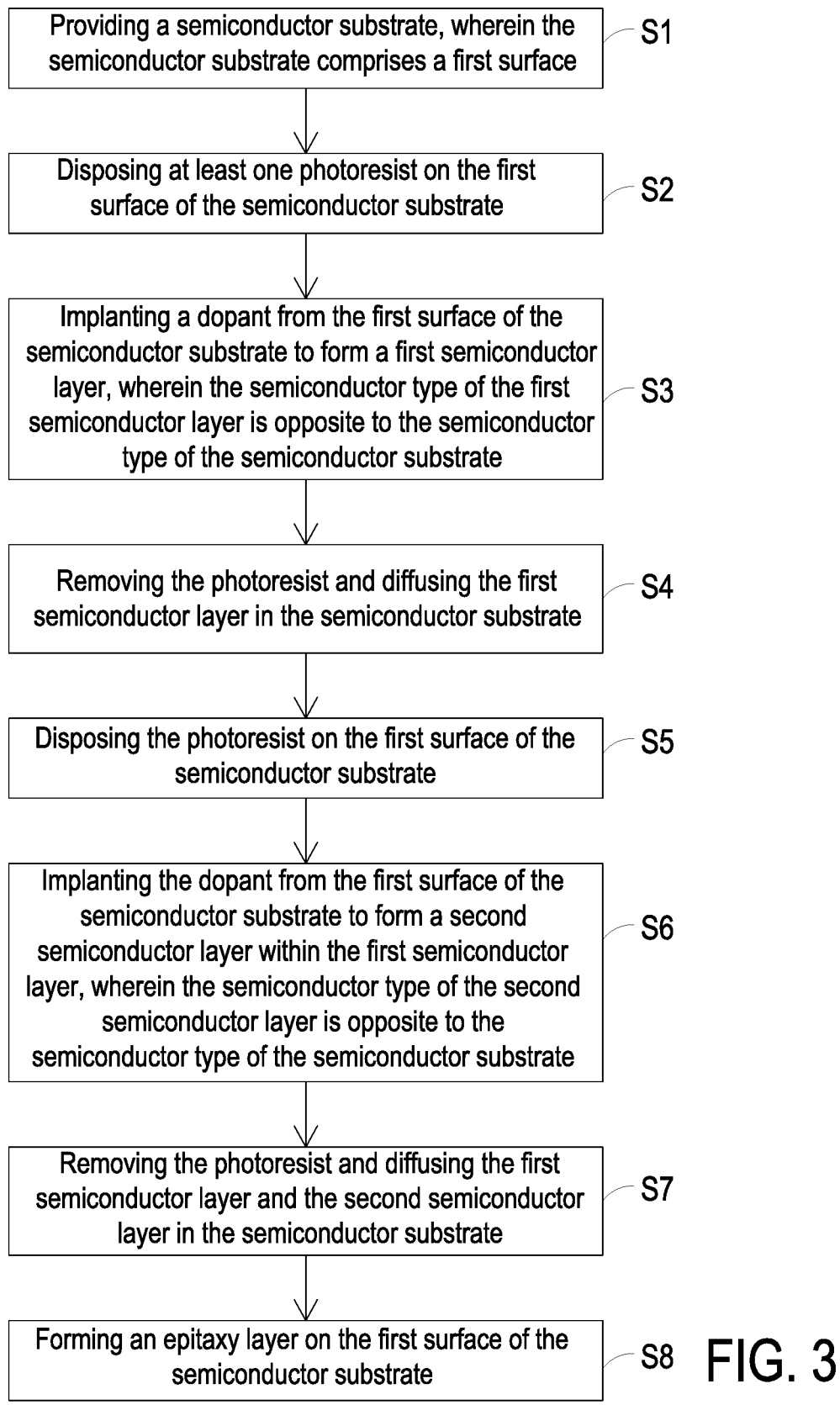
FIG. 3 is a flow chart showing a manufacturing method of a diode structure according to an embodiment of the present disclosure.
Figure 4B:
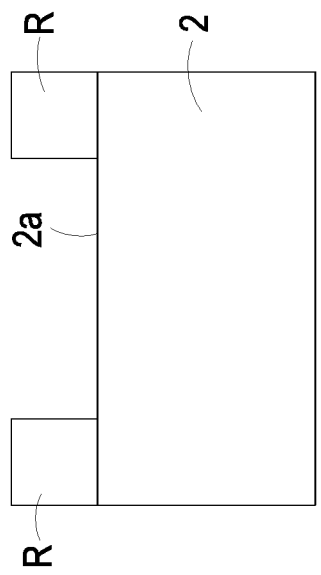
FIGS. 4A to 4H are cross sectional views illustrating the diode structure at several manufacturing stages according to the embodiment of the present disclosure.
Figure 4A:
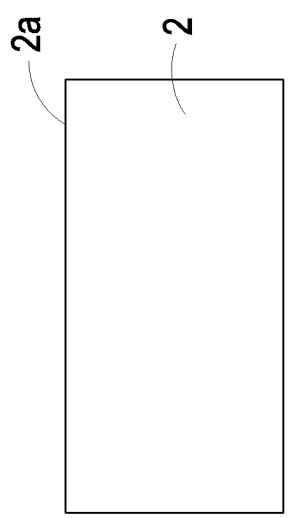
Figure 4C:
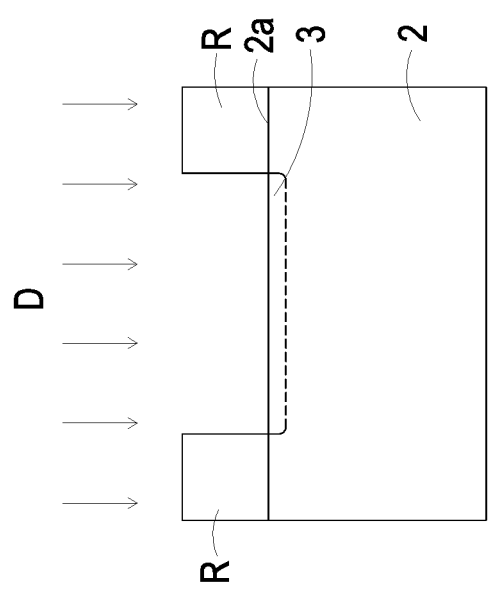
Figure 4D:
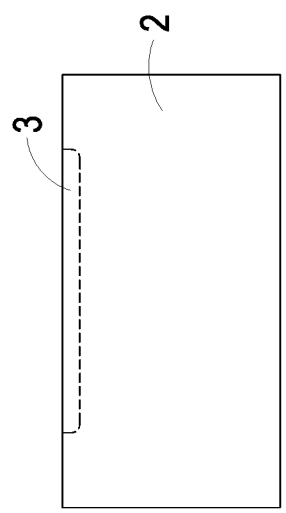
Figure 4F:
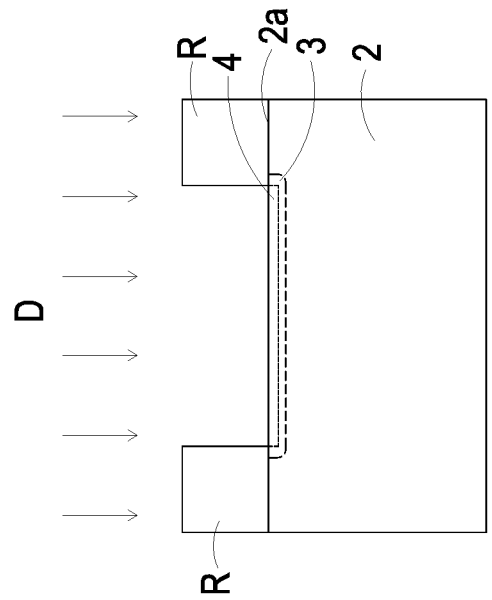
Figure 4E:
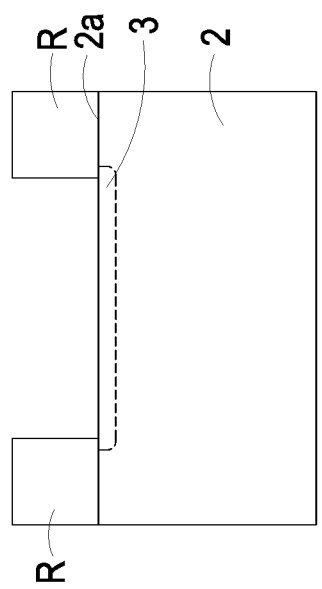
Figure 4H:
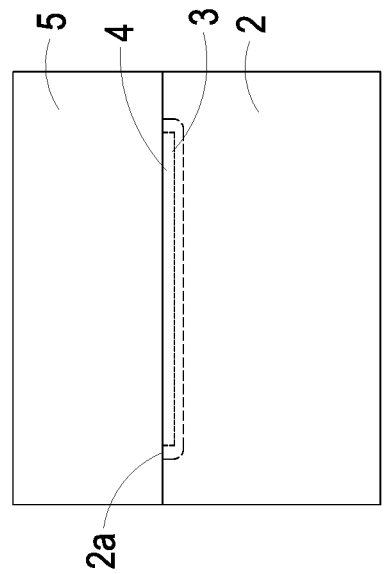
Figure 4G:
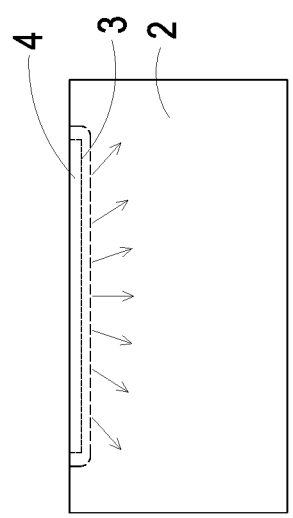

According to the structure of the diode described previously, the present disclosure further provides a manufacturing method of the diode structure 1. FIG. 3 is a flow chart showing a manufacturing method of a diode structure according to an embodiment of the present disclosure. FIGS. 4A to 4H are cross sectional views illustrating the diode structure at several manufacturing stages according to the embodiment of the present disclosure. As shown in FIGS. 3 and 4A to 4H, firstly, at the step S1, a semiconductor substrate 2 is provided. The semiconductor substrate 2 includes a first surface 2a, as shown in FIG. 4A. Then, at the step S2, at least one photoresist R is disposed on the first surface 2a of the semiconductor substrate 2, as shown in FIG. 4B. Thereafter, at the step S3, a dopant D is implanted from the first surface 2a of the semiconductor substrate 2 to form a first semiconductor layer 3, as shown in FIG. 4C. The semiconductor type of the first semiconductor layer 3 is opposite to the semiconductor type of the semiconductor substrate 2. Afterward, at the step S4, the photoresist R is removed, and the first semiconductor layer 3 is diffused in the semiconductor substrate 2, as shown in FIG. 4D. Thereafter, at the step S5, at least one photoresist R is disposed on the first surface 2a of the semiconductor substrate 2, as shown in FIG. 4E. Then, at step S6, the dopant D is implanted from the first surface 2a of the semiconductor substrate 2 to form a second semiconductor layer 4 within the first semiconductor layer 3, as shown in FIG. 4E The semiconductor type of the second semiconductor layer 4 is opposite to the semiconductor type of the semiconductor substrate 2. Afterward, at the step S7, the photoresist R is removed, and the first semiconductor layer 3 and the second semiconductor layer 4 are diffused in the semiconductor substrate 2, as shown in FIG. 4G. Finally, at the step S8, an epitaxy layer 5 is formed on the first surface 2a of the semiconductor substrate 2, as shown in FIG. 4H, and the process of manufacturing the diode structure 1 is completed.

In the embodiment, both of the step S3 and step S6 are performed through an implanting process for implanting the dopant D into the semiconductor substrate 2. That is, the dopant D is implanted into the semiconductor substrate 2 by the implanting process in two steps. The dopant D in the step S3 and step S6 are both antimony ion. The operating parameter of the implanting process includes a specific energy, a specific dose and a specific angle. The specific energy is greater than 50 keV, the specific dose is more than $1.0 \times 10^{15}/cm^2$, and the specific angle is 7 degrees, but not limited thereto. In this embodiment, both of the step S4 and step S7 are performed through a drive-in process for diffusing the first semiconductor layer 3 and the second semiconductor layer 4 in the semiconductor substrate 2. That is, the first semiconductor layer 3 and the second semiconductor layer 4 are formed in the semiconductor substrate 2 by the drive-in process in two steps. The operating parameter of the drive-in process includes a specific temperature and specific time. The specific temperature is higher than 1100° C., and the specific time is longer than 50 minutes, but not limited thereto. In this embodiment, the photoresist R in the step S2 and the step S5 are same and are disposed on the same position upon the first surface 2a of the semiconductor substrate 2, but not limited thereto. Thereby, the second semiconductor layer 4 is formed in the first semiconductor layer 3 and is surrounded by the first semiconductor layer 3 in the semiconductor substrate 2.

Figure 5:
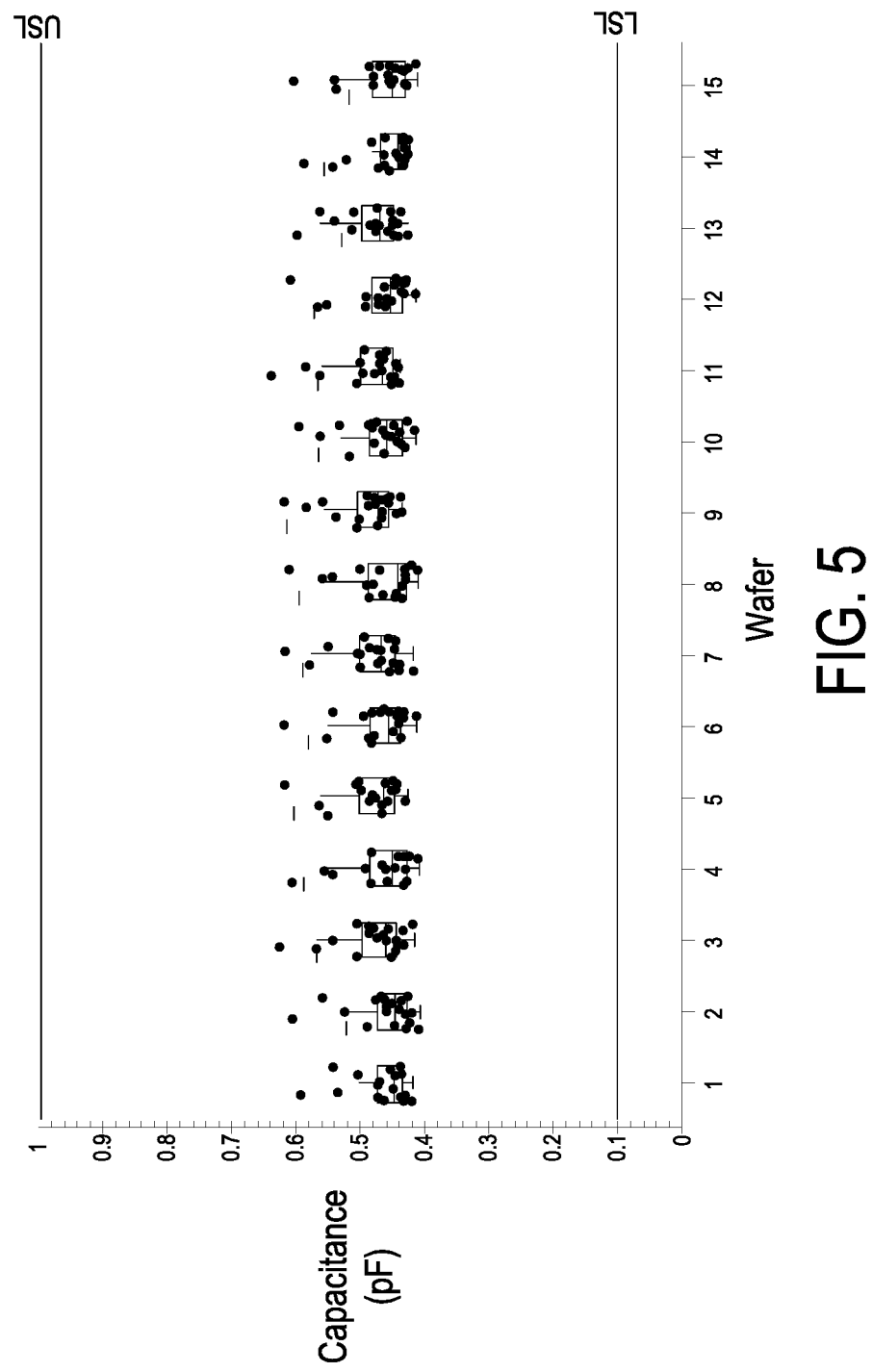
FIG. 5 is a candlestick chart showing the capacitance performance of the diode structure according to the embodiment of the present disclosure.

Please refer to FIGS. 2 and 5. FIG. 5 is a candlestick chart showing the capacitance performance of the diode structure according to the embodiment of the present disclosure. As shown in the figures, by the two-step's implanting and drive-in method, the concentration distribution of the dopant D within the semiconductor substrate 2 is in the discontinuous curve, and the uniformities of the dopant D within the first semiconductor layer 3 and the second semiconductor layer 4 are improved. Thereby, the capacitance performance of the diode structure 1 is kept in a range between a lower specification limit (LSL) and an upper specification limit (USL), and substantially in the range between 0.4 pF and 0.7 pF, as shown in FIG. 5. Therefore, the operating efficiency of the diode structure 1 is improved, and the operating stability of the diode structure 1 is ensured. Consequently, the ultra-low capacitance TVS device utilizing the diode structure 1 is capable of reliably achieving the efficacy of protecting the circuit.

From the above descriptions, the present disclosure provides a diode structure and a manufacturing method thereof. By the two-step's dopant implanting and drive-in method, the N+ type first semiconductor layer and second semiconductor layer are formed in the P+ type semiconductor substrate. The concentration distribution of the dopant within the first semiconductor layer and the second semiconductor layer is in a discontinuous curve. As a result, the distribution uniformities of the dopant within the first semiconductor layer and the second semiconductor layer are improved. The operating stability of the zener diode is improved, and the application requirement of low junction capacitance is satisfied. Consequently, the ultra-low capacitance TVS device with the diode structure is capable of reliably providing the function of protecting the circuit.

While the disclosure has been described in terms of what is presently considered to be the most practical and preferred embodiments, it is to be understood that the disclosure needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A diode structure, comprising:
   a semiconductor substrate comprising a first surface;
   a first semiconductor layer extended toward the interior of the semiconductor substrate from the first surface of the semiconductor substrate and comprising a dopant with a first concentration distribution, wherein the semiconductor type of the first semiconductor layer is opposite to the semiconductor type of the semiconductor substrate;
   a second semiconductor layer extended toward the interior of the semiconductor substrate from the first surface of the semiconductor substrate and comprising the dopant with a second concentration distribution, wherein the semiconductor type of the second semiconductor layer is opposite to the semiconductor type of the semiconductor substrate;
   an epitaxy layer formed on the first surface of the semiconductor substrate, connected with the first semiconductor layer and the second semiconductor layer and extended outwardly from the first surface;
   wherein the first semiconductor layer and the second semiconductor layer are connected with each other, continuously, and the concentration distribution of the dopant within the first semiconductor layer and the second semiconductor layer is in a discontinuous curve.

2. The diode structure according to claim 1, wherein the second semiconductor layer is formed within the first semiconductor layer and is surrounded by the first semiconductor layer in the semiconductor substrate.

3. The diode structure according to claim 1, wherein the discontinuous curve has an inflection point, and the inflection point is corresponding to the connecting surface between the first semiconductor layer and the second semiconductor layer, wherein the concentration of the dopant within the first semiconductor layer is lower than the concentration of the dopant within the second semiconductor layer.

4. The diode structure according to claim 1, wherein the semiconductor substrate is a P+ type semiconductor layer, both of the first semiconductor layer and the second semiconductor layer are N+ type semiconductor layers, and the epitaxy layer is a N−type semiconductor layer.

5. The diode structure according to claim 1, wherein the dopant is antimony ion.

6. The diode structure according to claim 1, wherein the diode structure is a zener diode and is employed in an ultra-low capacitance transient voltage suppression device.

* * * * *